United States Patent [19]
Boerstler

[11] Patent Number: 5,977,801
[45] Date of Patent: Nov. 2, 1999

[54] SELF-RESETTING PHASE/FREQUENCY DETECTOR WITH REDUCED DEAD ZONE

[75] Inventor: David William Boerstler, Round Rock, Tex.

[73] Assignee: International Business Machines Corporation, Armonk, N.Y.

[21] Appl. No.: 08/888,797

[22] Filed: Jul. 7, 1997

[51] Int. Cl.[6] .............................. H03D 13/00; H03K 5/26
[52] U.S. Cl. ...................................... 327/7; 327/12; 327/5
[58] Field of Search .................................. 327/2, 3, 5, 7, 327/12, 142, 155, 156

[56] References Cited

U.S. PATENT DOCUMENTS

| | | | |
|---|---|---|---|
| 4,354,124 | 10/1982 | Shima et al. | 327/12 |
| 4,439,278 | 4/1988 | Des Brisay Jr. et al. | 328/133 |
| 4,751,469 | 6/1988 | Nakagawa et al. | 327/7 |
| 4,804,928 | 2/1989 | Chloupek et al. | 331/1 A |
| 4,922,141 | 5/1990 | Lofgren et al. | 327/158 |
| 5,191,239 | 3/1993 | Rogers | 307/445 |
| 5,266,851 | 11/1993 | Nukui | 327/3 |
| 5,386,437 | 1/1995 | Yasuda | 327/7 |
| 5,422,603 | 6/1995 | Soyuer | 331/1 A |
| 5,436,596 | 7/1995 | Folmer | 331/1 A |
| 5,465,075 | 11/1995 | Yaklin | 331/8 |
| 5,485,125 | 1/1996 | Dufour | 331/17 |
| 5,491,439 | 2/1996 | Kelkar et al. | 327/157 |
| 5,546,052 | 8/1996 | Austin et al. | 331/1 A |
| 5,631,582 | 5/1997 | Fukolawa | 327/12 |
| 5,661,419 | 8/1997 | Bhagwan | 327/7 |

OTHER PUBLICATIONS

S. Khursheed Enam and Assad A. Abidi, *"NMOS IC's for Clock and Data Regeneration in Gigabit–per–Second Optical–Fiber Receivers,"* IEEE Journal of Solid–State Circuits, vol. 27, No. 12, Dec. 1992.

Ian A. Young, Jeffrey K. Greason, and Keng L. Wong, *"A PLL Clock Generator with 5 to 110 MHz of Lock Range for Microprocessors,"* IEEE Journal of Solid–State Circuits, vol. 27 No. 11, Nov. 1992.

Thomas H. Lee, Kevin S. Donnelly, John T.C. Ho, Jared Zerbe, Mark G. Johnson, and Toru Ishikawa, *"A. 2.5 V CMOS Delay–Locked Loop for an 18 Mbit, 500 Megabyte/s DRAM,"* IEEE Journal of Solid–State Circuits, vol. 29, No. 12, Dec. 1994.

Floyd M. Gardner, Ph.D, *"Phaselock Techniques,"* pp. 123–125.

*Primary Examiner*—Timothy P. Callahan
*Assistant Examiner*—Eunja Shin
*Attorney, Agent, or Firm*—Casimer K. Salys; Jack V. Musgrove; Andrew J. Dillon

[57] ABSTRACT

A phase/frequency detector, such as may be used in a phase-lock loop (PLL), having reduced jitter at high frequencies by reducing or eliminating the dead zone. The detector generates two output signals (UP and DOWN) wherein one of the output signals (depending upon which input signal arrives first) has a pulse width which is equal to a time delay between the input signals. There is a dead zone associated with very small phase differences between the input signals, and the dead zone is reduced by increasing the durations of two output pulses, using several delay elements which operate on signals that are derived from the reference and feedback inputs. The circuit may be tuned to reduce the dead zone to less than one picosecond, making it particularly useful for very high speed (greater than one gigahertz) clock circuits. The phase/frequency detector uses self-resetting, complementary metal-oxide semiconducting (SRCMOS) gates. First and second latches may be used to prevent the SRCMOS gates from discharging before a subsequent reset signal.

14 Claims, 6 Drawing Sheets

SELF-RESETTING PHASE/FREQUENCY DETECTOR WITH REDUCED DEAD ZONE

BACKGROUND OF THE INVENTION

1. Field of the Invention

The present invention generally relates to electric clock circuits, and more particularly to a clock circuit that uses a phase-lock loop (PLL) circuit having a phase/frequency detector with reduced jitter at high frequencies.

2. Description of the Related Art

Electric circuits that provide clock signals are used in a wide assortment of electronic devices, and particularly in computer systems. Microprocessors and other computer components, such as random access memory (RAM), use clock signals to synchronize various high-speed operations. These computer clock circuits often use a phase-lock loop (PLL) circuit to de-skew (synchronize) an internal logic control clock to an external system clock.

A typical prior art PLL circuit includes a phase and frequency detector, a low-pass filter, and a voltage-controlled oscillator (VCO). The phase/frequency detector compares two input signals, a reference signal (from the external system clock) and a feedback signal, and generates a phase error signal that is a measure of their phase difference. The phase error signal from the detector is filtered by the low-pass filter and fed into the control input of the VCO. The VCO generates a periodic signal with a frequency which is controlled by the filtered phase error signal. The VCO output is coupled to the feedback input of the phase/frequency detector, thereby forming a feedback loop. If the frequency of the feedback signal is not equal to the frequency of the reference signal, the filtered phase error signal causes the VCO frequency to shift toward the frequency of the reference signal, until the VCO finally locks onto the frequency of the reference. The output of the VCO is then used as the synchronized (internal logic control) signal. The feedback loop may contain other components such as charge pumps, dividers, clock buffers or clock distribution networks. In cases where the incoming data is a self-clocking bit stream, the comparator system is used to extract the clock information from the data stream itself.

Figure 1:
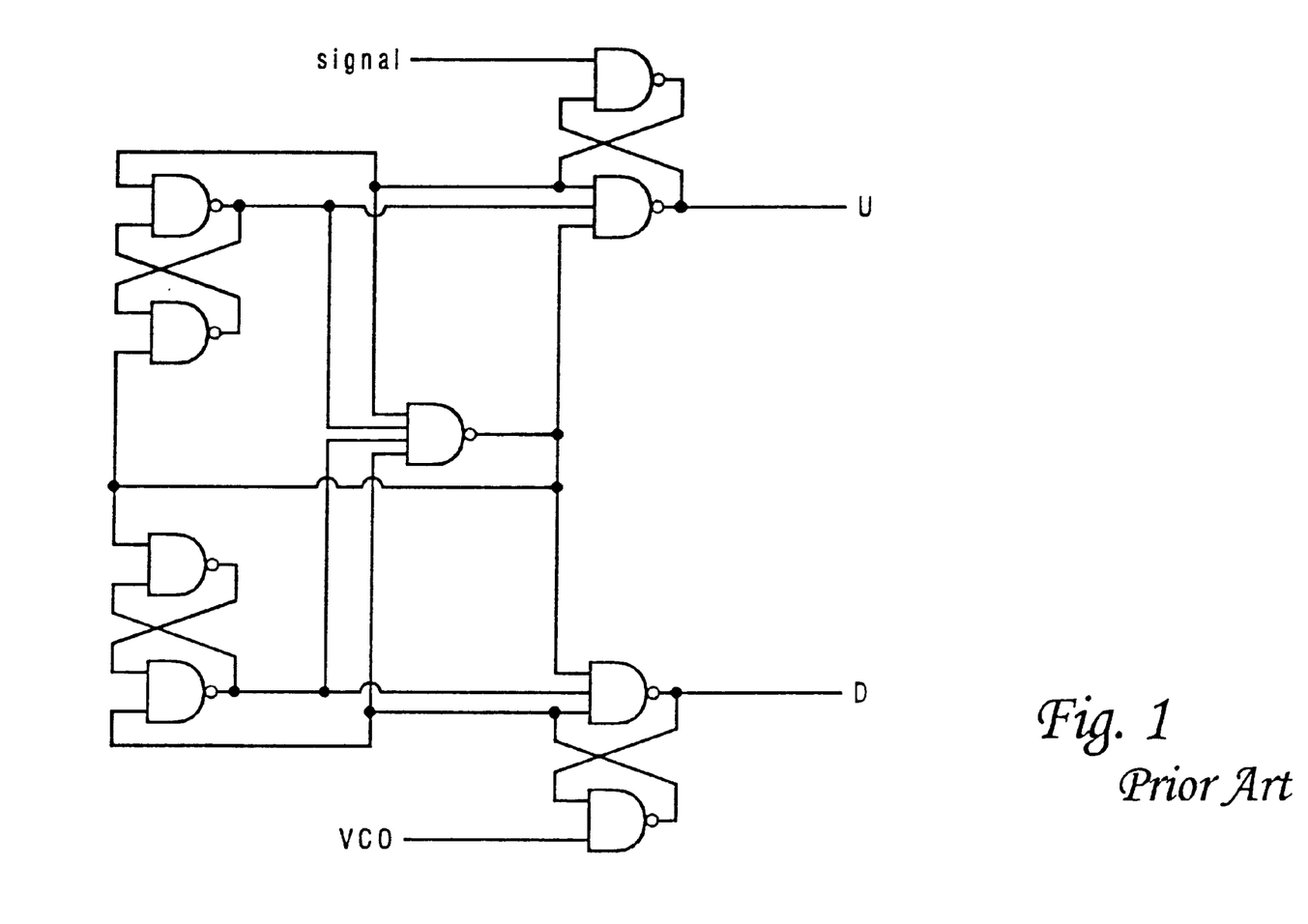
FIG. 1 is schematic diagram of a prior art sequential phase/frequency detector used by a conventional phase-lock loop (PLL) circuit.

FIG. 1 illustrates a sequential phase/frequency detector (PFD) that is commonly used in PLLs. That PFD consists of four flip-flops and a four-input (reset) NAND gate, and has two outputs, up (U) and down (D). Each of these outputs can be in either a low voltage state or a high voltage state, and each has a duty ratio ($d_U$ and $d_D$) which is the fractional amount of time that a given terminal is in the low state. The phase error signal used by the VCO is a function of these duty ratios ($d_U$–$d_D$). This particular PFD has several advantages, among them, aperiodicity and an active phase range of ±360° (twice as large of many other PFDs), as noted in "Phaselock Techniques," F. Gardner, pp. 123–125 (1979).

Another conventional sequential phase/frequency detector is described in the article "A PLL Clock Generator with 5 to 110 MHz of Lock Range for Microprocessors," IEEE Journal of Solid-State Circuits, vol. 27, no. 1 (November 1992). That circuit is noted as being able to operate at very high frequencies (up to 400 MHz), since its critical path is limited by just three gate delays: two from cross-coupled, two-input NAND gates (in one of the two flip-flops, flops), band one from a four-input reset NAND gate. This PLL uses complementary metal-oxide semiconducting (CMOS) technology.

One problem with phase/frequency detectors is that jitter is introduced into the loop due to the "dead zone." The phase error signal that controls the VCO has a first polarity in the case where the reference signal has a phase lag, and the other polarity when a phase lead is detected. For very small phase differences (e.g., the zero-phase-error, steady-state condition of the locked PLL), in the transition from one polarity to the other there is often a region referred to as the dead zone where the phase error signal is insensitive to phase-difference changes. However, it is important that the control characteristic of the PLL be linear in a phase-difference interval that contains the zero-phase-error point, in order to avoid the VCO uncontrollably changing its phase. In this dead zone (or dead band) the VCO's eventual output signal is unpredictable and liable to dither. Several techniques have accordingly been devised to shrink the range of the dead zone.

One of these techniques is described in U.S. Pat. No. 5,546,052 which is very similar to the circuit of FIG. 1 except for the use of an additional NAND gate (reference numeral 110 of that patent). The reset path delay is increased to reduce the dead zone. The assertion time for all the outputs is extended, which ideally appears as a common-mode signal to the subsequent stages. Unavoidable layout and technology-dependent mismatches in the charge pump and large-area filter stages of the PLL significantly increase the error using such an approach, since the effect is not truly common-mode. Furthermore, the pulse width is extended by four gate delays using this approach (the interval over which the mismatch is integrated), greatly magnifying the error. This approach is generally thus not suitable for very high performance PLLs. See also U.S. Pat. No. 5,491,439.

Another of these techniques is described in U.S. Pat. No. 5,422,603. The dead-zone contribution of the charge pump filter is reduced by using a fully symmetric charge pump architecture, and by fully differential implementation of the loop filter. While this construction is an improvement over the above-noted patents, the pulse width is still determined by the reset path delay and is only coarsely adjustable. A similar design is disclosed in U.S. Pat. No. 5,436,596, in which the reset signal which keeps both the current sink and current source temporarily alive to avoid a dead zone region. A three-input AND gate driven by a signal divided down from the reference clock. The reference clock signal is added to reduce the effects of process, temperature and design features, but that invention also suffers from the same problems as the '603 invention.

In U.S. Pat. No. 4,804,928, a phase/frequency detector is disclosed which is configurable as either a phase or frequency detector. That circuit has the same rest path and delay dependence mentioned above. Unbalanced delays on the charge and discharge paths (reference numerals 16 and 18 of FIG. 1 of that patent) further aggravate the common-mode issues.

A generic phase detector with overlapping UP and DOWN outputs is included as part of the invention of U.S. Pat. No. 5,485,125. An asynchronous reset is available on this phase detector, and is asserted when overlapping outputs are detected, lowering the dead zone. The speed of the reset path (reference numerals 31 and 53 of FIG. 2 of that patent) limits the effectiveness of this approach, as in the other patents.

Yet another approach to minimizing jitter involves minimizing noise input to the VCO via the control voltage lines. See, e.g., U.S. Pat. No. 5,465,075. A plurality of power-down transistors are arranged in the control circuit, and the VCO circuit's gain may be selected at the minimum gain required to lock the PLL over a predetermined range of process and operating conditions. This approach does not address, however, reduction of the dead zone, and the foregoing issues still apply.

Another phase/frequency detector which is reminiscent of FIG. 1 is shown in U.S. Pat. No. 4,739,278, except that the NAND gates have been replaced with NOR gates. The reset gate is coupled to the latches such that additional gate delays are provided to ensure that the output signals of the discriminator reach the full logic amplitudes. The advantage of this adaptation is that the path dependence is reduced from the four-input NAND version of FIG. 1. The limitations of this approach regarding the dead zone are otherwise identical to the detector of FIG. 1.

Many of the foregoing approach to minimizing the dead zone are particularly complicated, and do not completely eliminate dead zone concerns. This is particularly true for high frequencies (greater than 1 GHz) since the dead zone problem becomes more pronounced due to circuit switching speed and rise time limitations (the circuits do not respond unless their switching thresholds have been exceeded). It would, therefore, be desirable and advantageous to devise a PLL clocking circuit having a phase/frequency detector which effectively eliminates jitters resulting from the dead zone at such high frequencies.

SUMMARY OF THE INVENTION

It is therefore one object of the present invention to provide an improved clock circuit, such as may be used with a microprocessor.

It is another object of the present invention to provide such a clock circuit having a phase-lock loop which uses a phase/frequency detector to synchronize a clock signal, wherein the phase/frequency detector has no jitter associated with the dead zone.

It is yet another object of the present invention to provide a clock circuit using such a phase/frequency detector which has a self-resetting circuit topology.

The foregoing objects are achieved in a phase/frequency detector generally comprising a first input for receiving a first input (reference) signal, a second input for receiving a second input (feedback) signal, means connected to the first and second inputs for generating first and second output pulses wherein, if the reference signal arrives before the feedback signal, the first output pulse has a duration which is proportional to a time delay between the first and second input signals but, if the second input signal arrives before the first input signal, the second output pulse has a duration which is proportional to a time delay between the first and second input signals, the generating means having a dead zone associated with very small phase differences between the first and second input signals, and further comprising means for reducing the dead zone by increasing the durations of the first and second output pulses. The means for reducing the dead zone may include a plurality of logic gates having at least one gate delay, and the durations of the first and second output pulses are increased by a non-whole fraction of the gate delay. The means for reducing the dead zone may further include a first delay element having a delay $\tau_1$, and a second delay element having a delay $\tau_2$, such that the non-whole fraction is equal to $\tau_1-\tau_2$. The generating means has a reset path, and the means for reducing the dead zone (the delay elements) is outside of the reset path. The circuit may be tuned to reduce the dead zone to less than one picosecond, making it particularly useful for very high speed (greater than one gigahertz) clock circuits. The phase/frequency detector may advantageously use self-resetting, complementary metal-oxide semiconducting (SRCMOS) gates for providing first and second derived signals based on the reference and feedback signals, respectively. First and second latches may be used to prevent the SRCMOS gates from discharging before a subsequent reset signal. The phase/frequency detector can be used in a phase-lock loop circuit by providing a charge pump having inputs which receive the first and second output pulses, a low-pass filter connected to an output of the charge pump, and a voltage-controlled oscillator controlled by the low-pass filter and providing the feedback signal to the phase/frequency detector.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF THE PREFERRED EMBODIMENT

Figure 2:
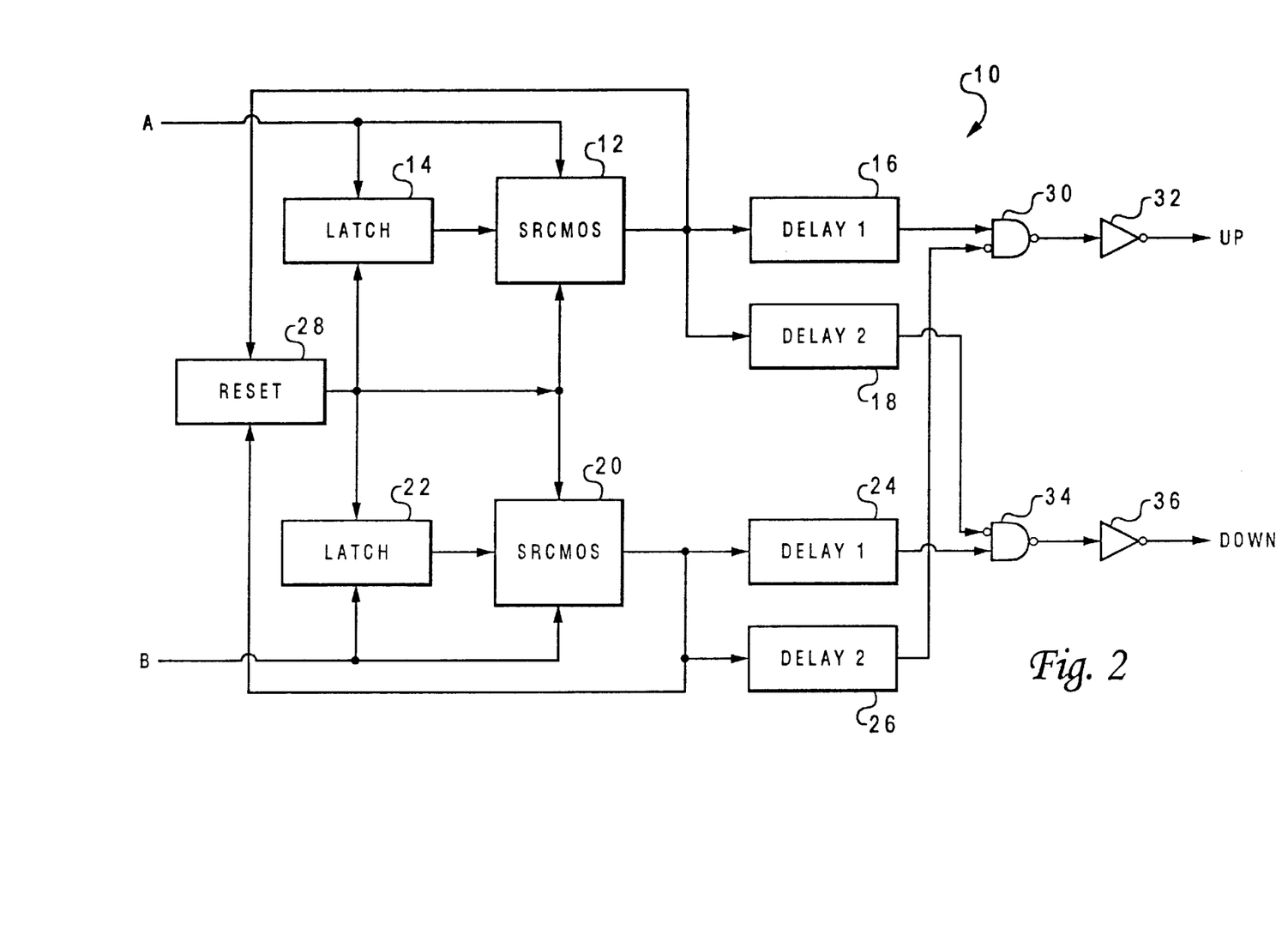
FIG. 2 is a block diagram of one embodiment of a phase/frequency detector constructed in accordance with the present invention.

With reference now to the figures, and in particular with reference to FIG. 2, there is depicted one embodiment 10 of the phase/frequency detector (PFD) of the present invention. PFD 10 is adapted for use in a phase-lock loop (PLL) circuit having other components such as a charge pump and a voltage-controlled oscillator (VCO). As explained further below, PFD 10 is particularly useful in a PLL circuit designed for a high-speed computer clock circuit.

PFD 10 has two inputs which receive signals A and B (the reference signal and VCO signal, respectively). Signal A is provided as an input to a self-resetting, complementary metal-oxide semiconducting (SRCMOS) gate 12, and as an input to a latch 14 that is connected to SRCMOS gate 12. The output of SRCMOS gate 12 is provided to two delay elements 16 and 18 having different delay values (delay1 and delay2, respectively). A similar circuit is used with signal B, which is provided as an input to a SRCMOS gate 20, and as an input to a latch 22 that is connected to SRCMOS gate 20. The output of SRCMOS gate 20 is provided to two more delay elements 24 and 26 having the two delay values delay1 and delay2, respectively. The outputs of SRCMOS gates 12 and 20 are also provided to a reset circuit 28 which controls both SRCMOS gates and the latches 14 and 22.

The outputs of the four delay elements are combined to create the two UP and DOWN signals which are the outputs of PFD 10. Specifically, the output of delay element 16 and the inverted output of delay element 26 are provided as inputs to an NAND gate 30. The output of NAND gate 30 is provided as an input to an inverter 32 whose output is the UP signal, which is delivered to the charge pump. Similarly, the inverted output of delay element 18 and the output of delay element 24 are provided as inputs to another NAND gate 34 whose output is connected to an inverter 36. The output of inverter 36 is used as the DOWN signal, which is also delivered to the charge pump.

Figure 3A:
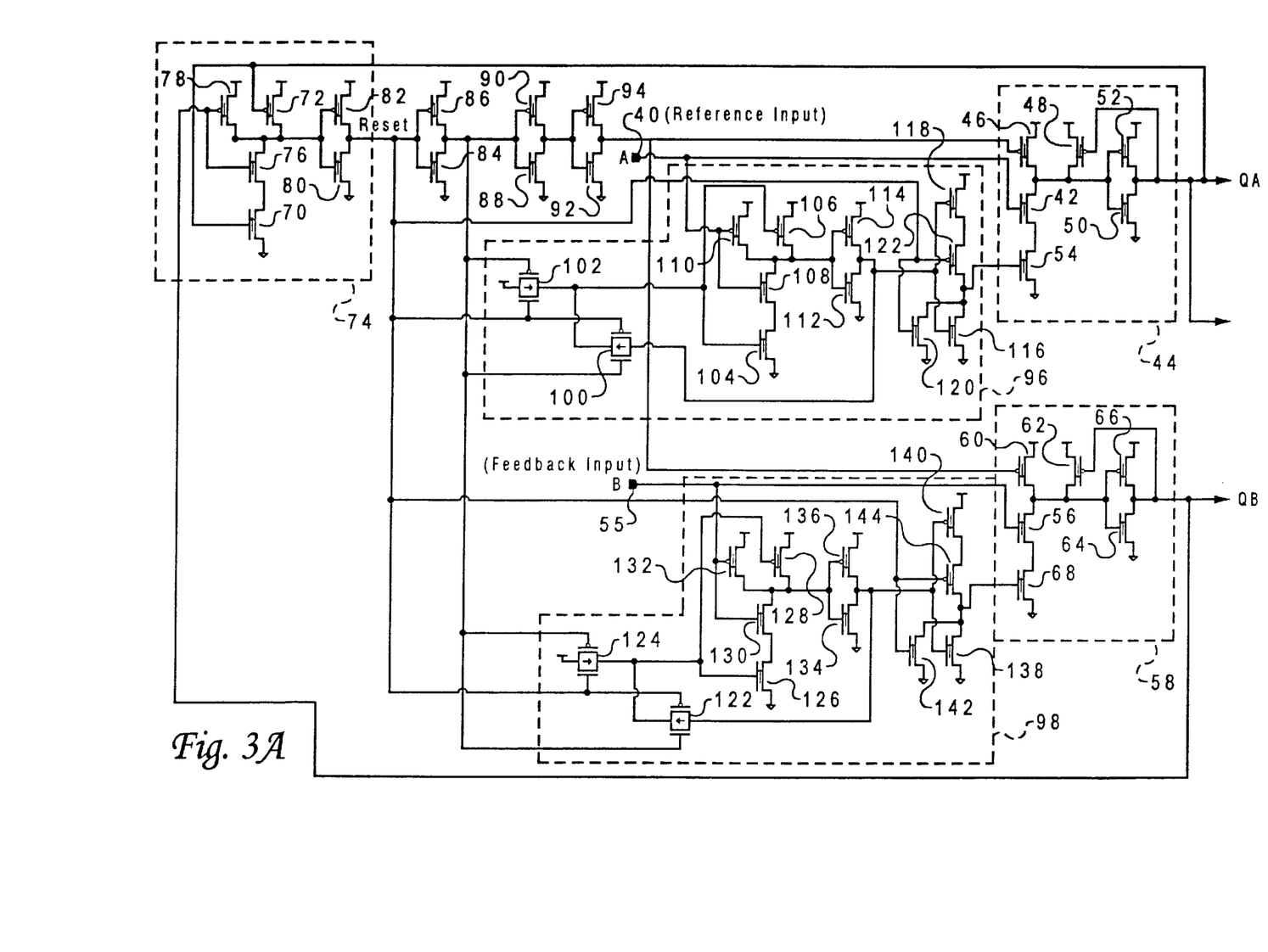
FIGS. 3A and 3B are detailed schematic diagrams illustrating one implementation of the phase/frequency detector of FIG. 2.
Figure 3B:
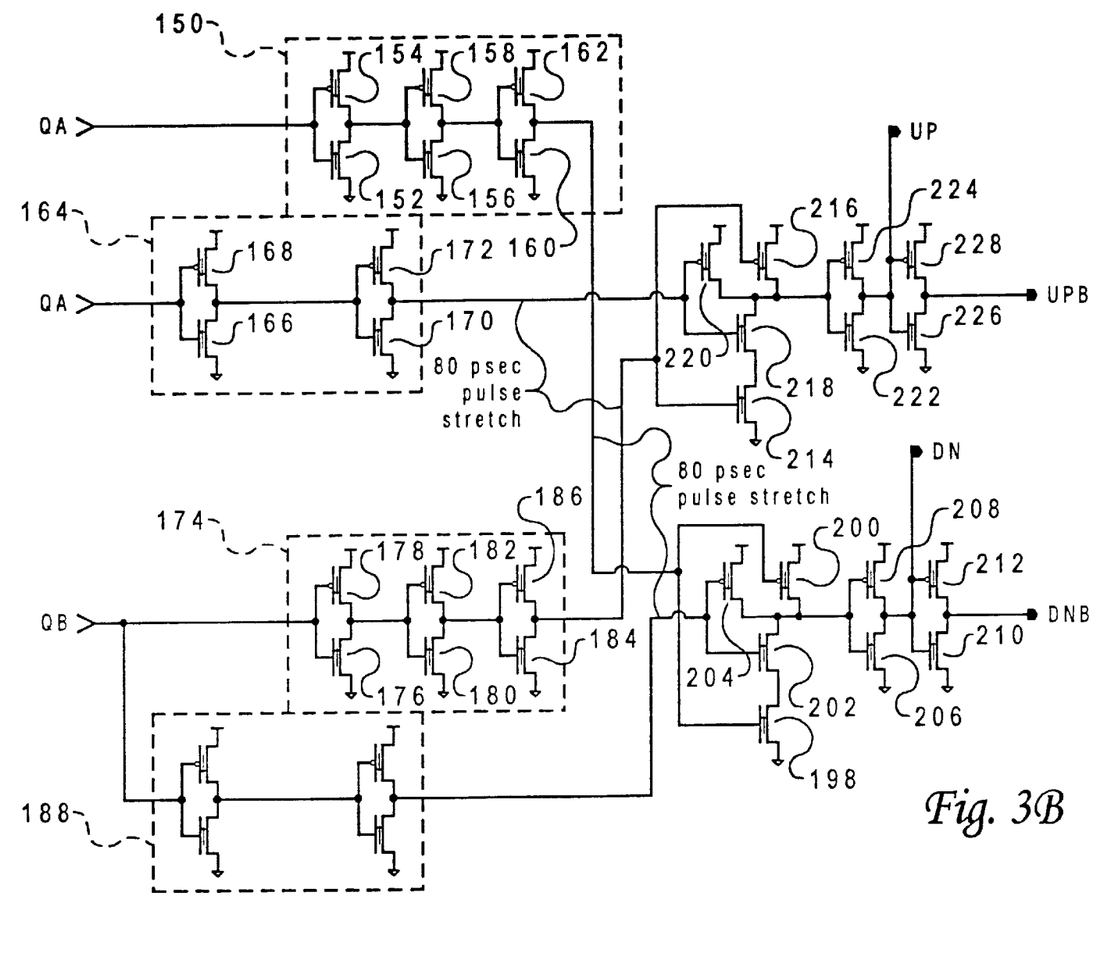

A specific implementation of the circuit of FIG. 2 is further shown in FIGS. 3A and 3B. Reference signal 40 (A) is connected to the gate of an n-type metal-oxide semiconducting field-effect transistor (NFET) 42 that is part of an SRCMOS gate 44. The source of NFET 42 is connected to a precharge device that includes a p-type metal-oxide semiconducting field-effect transistor (PFET) 46, another PFET 48 and an inverter composed of an NFET 50 and a PFET 52. The sources of PFETs 46 and 48 are connected to the power supply ($V_{dd}$), and the drains of PFETs 46 and 48 are connected to the source of NFET 42, and to the gates of NFET 50 and PFET 52. The source of PFET 52 is also connected to $V_{dd}$, and the drain of NFET 50 is connected to ground. The source of NFET 50 is connected to the drain of PFET 52, and the output of the inverter is fed back to the gate of the weak device 48. The drain of NFET 42 is connected to the source of another NFET 54 whose drain is connected to ground.

The feedback signal 55 (B) from the VCO is similarly connected to the gate of another NFET 56 that is part of an SRCMOS gate 58. The source of NFET 56 is connected to a precharge device that includes a PFET 60, another PFET 62 and an inverter composed of an NFET 64 and a PFET 66. The sources of PFETs 60 and 62 are connected to $V_{dd}$, and the drains of PFETs 60 and 62 are connected to the source of NFET 56, and to the gates of NFET 64 and PFET 66. The source of PFET 66 is also connected to $V_{dd}$, and the drain of NFET 64 is connected to ground. The source of NFET 64 is connected to the drain of PFET 66, and the output of this inverter is fed back to the gate of the weak device 62. The drain of NFET 56 is connected to the source of another NFET 68 whose drain is connected to ground.

The output of the inverter formed by NFET 50 and PFET 52 is the output of SRCMOS gate 44 (signal QA), and is connected to another NFET 70 and another PFET 72 which are part of the reset circuit 74. Similarly, the output of the inverter formed by NFET 64 and PFET 66 is the output of SRCMOS gate 58 (signal QB), and is connected to another NFET 76 and another PFET 78 which are also part of the reset circuit 74. NFETs 70 and 76 and PFETs 72 and 78 comprise an NAND gate whose output (the drains of PFETs 72 and 78) is connected to an inverter composed of another NFET 80 and another PFET 82. The output of this inverter is the reset signal (R). The reset signal passes through three other inverters (composed respectively from NFET 84 and PFET 86; from NFET 88 and PFET 90; and from NFET 92 and PFET 94), and the inverted and delayed (or final $\overline{\text{reset}}$) signal ($\overline{\text{R}}$) is then connected to the gates of PFETs 46 and 60.

The reset signal is also transmitted to a latch 96 connected to SRCMOS gate 44, and to a latch 98 connected to SRCMOS gate 58. The output of the inverter from NFET 80 and PFET 82 is connected to the gate of a PFET forming part of a CMOS transmission gate 100 in latch 96, and to the gate of an NFET forming part of another CMOS transmission gate 102 in latch 96. The inverted early $\overline{\text{reset}}$ signal $\overline{\text{R}}$ from the inverter composed of NFET 84 and PFET 86 is fed to the gate of an NFET of CMOS transmission gate 100, and to the gate of a PFET of CMOS transmission gate 102. The source of CMOS transmission gate 102 is connected to $V_{dd}$, while the drain of CMOS transmission gate 102 is connected to the drain of CMOS transmission gate 100, and to the gate of another NFET 104 and the gate of another PFET 106. NFET 104 and PFET 106 form another NAND gate along with another NFET 108 and another PFET 110. The other input to this NAND gate is the reference signal A. The output of this NAND gate (i.e., the drains of PFETs 106 and 110) is connected to the input of another inverter composed of an NFET 112 and a PFET 114. The output of this inverter is connected to the source of CMOS transmission gate 100 and to the gate of an NFET 116 and the gate of a PFET 118, which comprise one input of an OR gate. The second input of this OR gate is comprised of another NFET 120 and another PFET 122, the gates of which are connected to the early reset signal (from NFET 80 and PFET 82).

The reset signals are transmitted to latch 98 in a similar manner. The output of the inverter from NFET 80 and PFET 82 is connected to the gate of a PFET forming part of a CMOS transmission gate 122 in latch 98, and to the gate of an NFET forming part of another CMOS transmission gate 124 in latch 98. The inverted early $\overline{\text{reset}}$ signal $\overline{\text{R}}$ from the inverter composed of NFET 84 and PFET 86 is fed to the gate of an NFET of CMOS transmission gate 122, and to the gate of a PFET of CMOS transmission gate 124. The source of CMOS transmission gate 124 is connected to $V_{dd}$, while the drain of CMOS transmission gate 124 is connected to the drain of CMOS transmission gate 122, and to the gate of another NFET 126 and the gate of another PFET 128. NFET 126 and PFET 128 form another NAND gate along with another NFET 130 and another PFET 132. The other input to this NAND gate is the feedback signal B (VCO). The output of this NAND gate (i.e., the drains of PFETs 128 and 132) is connected to the input of another inverter composed of an NFET 134 and a PFET 136. The output of this inverter is connected to the source of CMOS transmission gate 122 and to the gate of an NFET 138 and the gate of a PFET 140, which comprise one input of an OR gate. The second input of this OR gate is comprised of another NFET 142 and another PFET 144 the gates of which are connected to the reset signal (from NFET 80 and PFET 82).

Turning to FIG. 3B, the derived signal QA from SRCMOS 44 is fed to a first delay element 150 comprised of three inverters consisting, respectively, of an NFET 152 and a PFET 154, an NFET 156 and a PFET 158, and an NFET 160 and a PFET 162. Signal QA is also fed to a second delay element 164 comprised of two inverters consisting, respectively, of an NFET 166 and a PFET 168, and an NFET 170 and a PFET 172. The derived signal QB from SRCMOS 58 is fed to a third delay element 174 comprised of three inverters consisting, respectively, of an NFET 176 and a PFET 178, an NFET 180 and a PFET 182, and an NFET 184 and a PFET 186. Signal QB is also fed to a fourth delay element 188 comprised of two inverters consisting, respectively, of an NFET 190 and a PFET 192, and an NFET 194 and a PFET 196.

The outputs of the four delay elements are combined to generate the UP and DOWN signals. The output of first delay element 150 is fed to the gates of an NFET 198 and a PFET 200 which form a NAND gate together with another NFET 202 and PFET 204. The gates of these latter two devices (i.e., the second input of the NAND gate) are connected to the output of fourth delay element 188. The output of the NAND gate (i.e., the drains of PFETs 200 and 204) is fed to an inverter (i.e., to the gates of NFET 206 and a PFET 208), whose output is the DOWN signal.

Another inverter formed of an NFET 210 and a PFET 212 is used to provide the inverted DOWN signal. In a similar manner, the output of third delay element 174 is fed to the gates of an NFET 214 and a PFET 216 which form a NAND gate together with another NFET 218 and PFET 220. The gates of these latter two devices (i.e., the second input of this NAND gate) are connected to the output of second delay element 164. The output of this NAND gate (i.e., the drains of PFETs 216 and 220) is fed to an inverter (i.e., to the gates of an NFET 222 and a PFET 224), whose output is the UP signal. Another inverter formed of an NFET 226 and a PFET 228 is used to provide the inverted UP signal.

The phase-frequency detector of the present invention operates at high frequencies (greater than one gigahertz) with little or no dead zone, as explained further below, and therefore is highly suitable for use in a PLL for a high-speed computer clock circuit. The circuit is capable of very high-speed operation due, in part, to the self-resetting circuit topology. Initially, the detector is in the precharged state with both inputs (A and B) low, foot devices 54 and 68 are active. The reset node (R) is low (and the inverted reset signal high, or unasserted) with keeper devices 48 and 62 on, QA and QB are low, and the outputs (UP and DOWN) are low. The first rising transition on either input A or B discharges its corresponding precharged node 42 or 56, asserting QA or QB and one of the outputs UP or DOWN (UP is asserted if the reference input arrives first; DOWN is asserted if the feedback input arrives first). The second rising transition discharges its precharged node in a similar manner and turns off the previously asserted output. The output therefore has been asserted for a time interval corresponding to the phase difference between the two signals (explained in more detail below). The reset signal (R) is asserted (reset is the logical AND function of the A and B signals), disabling both foot devices 54 and 68 prior to precharging by the subsequent assertion of the inverted reset signal $\overline{R}$ at devices 46 and 60. The reset signal also sets latches 96 and 98 which keep the foot devices disabled after the reset signal de-asserts. The inverted reset signal controlling devices 46 and 60 is asserted after sufficient time to allow the foot devices to be disabled, precharging the input stages, de-asserting nodes QA and QB, and de-asserting R and R. Keeper devices 48 and 62 hold the precharged nodes high. Thereafter, falling transitions on the inputs enable the foot devices and reset the latches. The cycle is complete and the process repeats for subsequent cycles. The novel detector of the present invention can thus be used in conjunction with conventional components like a charge pump, filter and VCO to construct an improved PLL circuit.

For very small phase differences between the input signals, the output signals UP and DOWN will not be asserted due to the finite signal transition time and the nonzero switching threshold of the circuits, creating a dead-zone. The dead zone can be reduced or eliminated by delaying the effect of the second rising transition (which de-asserts the outputs), effectively increasing the duration of the output pulses. Pulses will exist on both outputs simultaneously for small phase errors, which may be considered as common-mode signals in the subsequent charge-pump and filtering stages. For zero-phase error, the pulse widths on UP and DOWN are equal, and can be made to be arbitrarily small if desired. For small but finite phase errors, the pulse width of one output will be larger than the other, but the common mode effect removes all but the desired difference signal.

Figure 4:
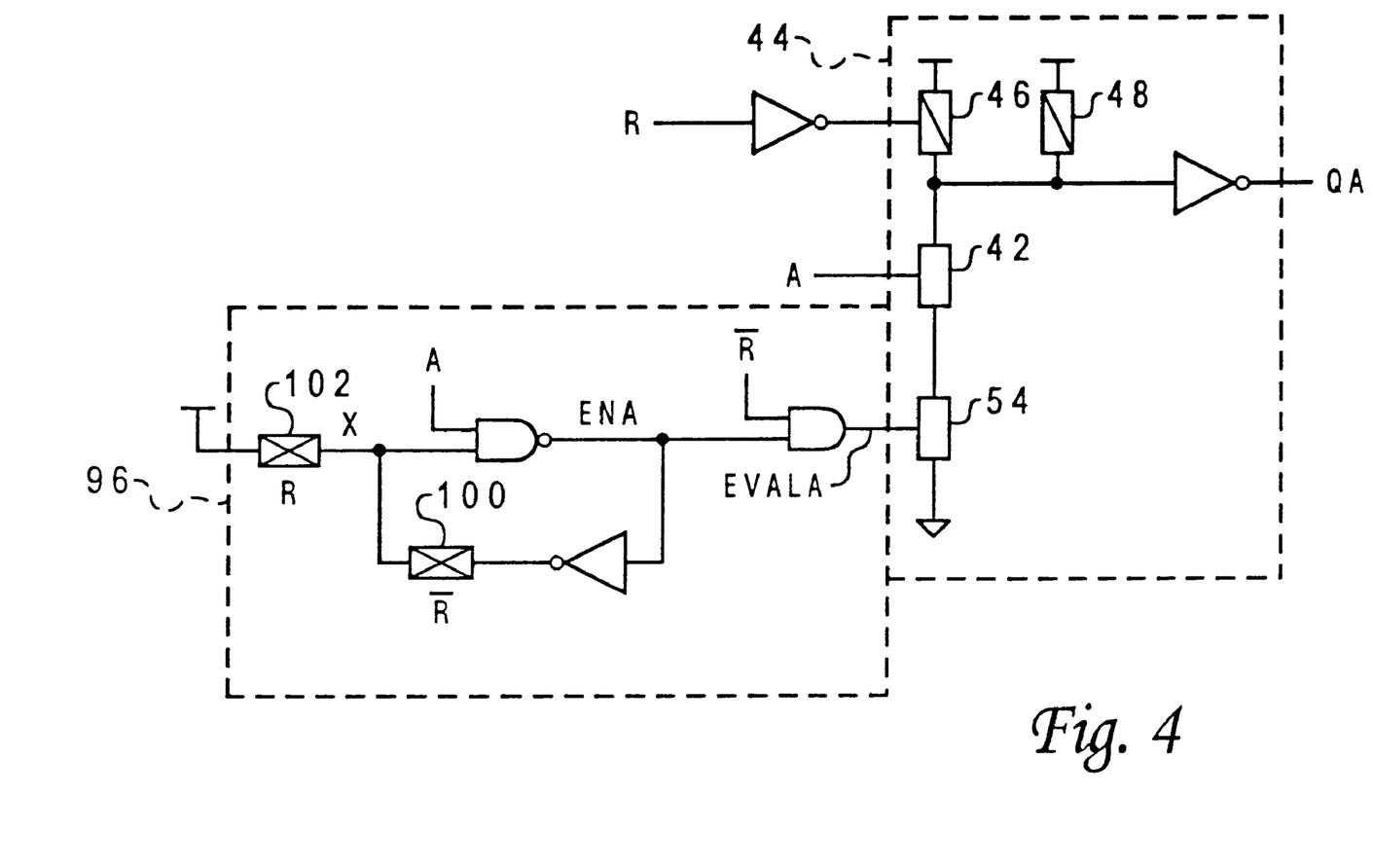
FIG. 4 is a higher level schematic diagram of a circuit that is equivalent to a portion of the circuit of FIG. 3A.
Figure 5:
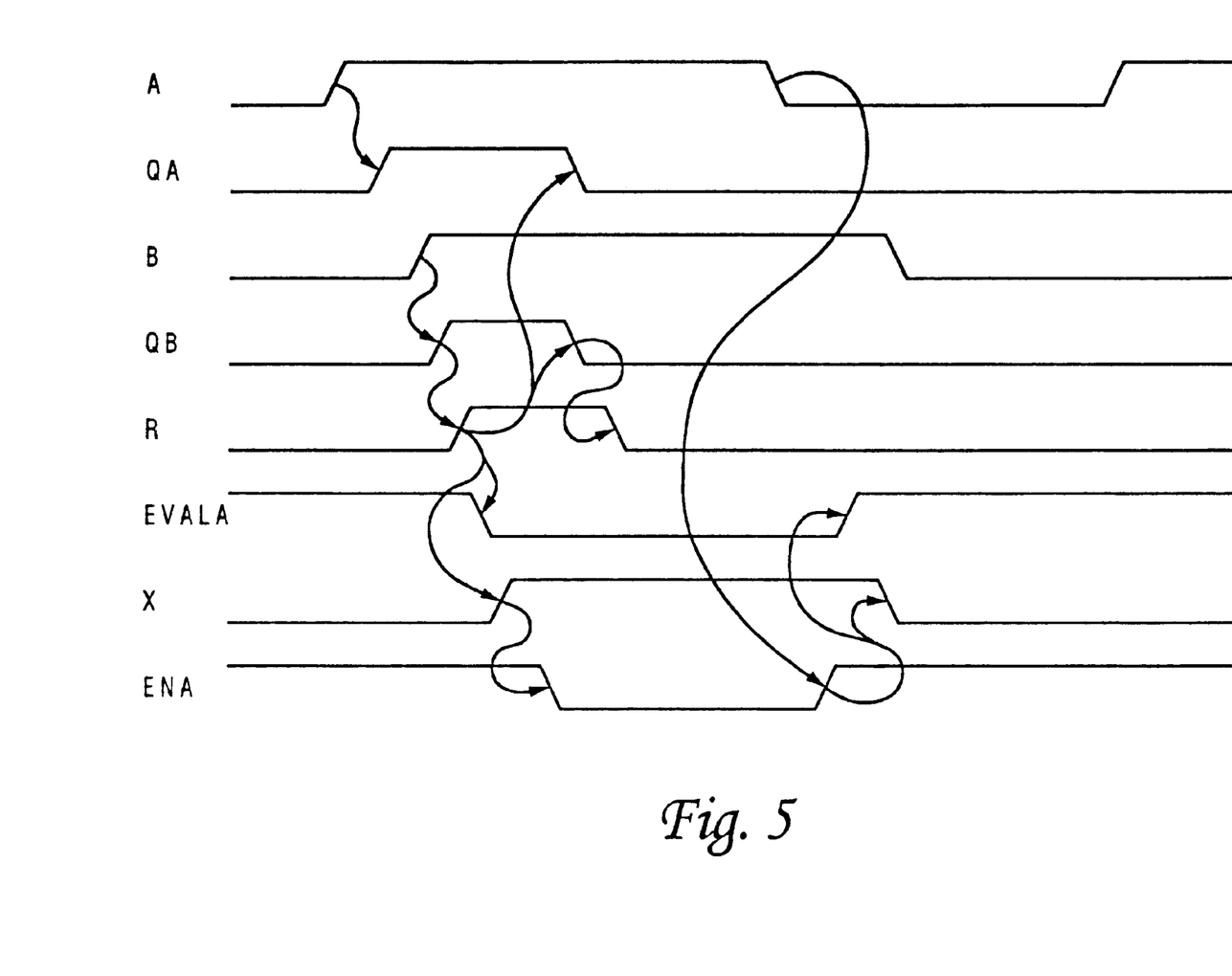
FIG. 5 is a timing diagram showing the relative timing of various signals shown in FIG. 4.

The operation of the phase/frequency detector of the present invention may further be understood with reference to FIG. 4, which shows a higher level diagram of a circuit that is equivalent to a portion of the circuit of FIG. 3A (including SRCMOS gate 44 and latch 96), and provides labels for various nodes. These labels correspond to the signals shown in the timing diagram of FIG. 5, wherein the reference signal A arrives before feedback signal B. The rising transition of the reference signal triggers signal QA, and the rising transition of the feedback signal triggers signal QB. When QB is asserted (and since QA is already asserted), the reset signal is activated, which causes QA and QB to de-assert. Thus, the difference between the rising edges of the signals QA and QB is equal to the time delay between the rising edges of the reference and feedback signals. In this regard, it is particularly advantageous to use the SRCMOS gates which have a very fast rise time and can be tightly controlled as opposed to, e.g., domino logic. The reset signal is de-activated when QA and QB are de-asserted.

When the reset signal is active, it also causes the signal (EVALA) controlling NFET 54 to drop from high to low, and causes the output (signal X) of CMOS transmission gate 102 to go from low to high. This latter transition causes the output (signal ENA) of the NAND gate in latch 96 to drop from high to low. Sometime thereafter, when the reference signal de-asserts, the output of the NAND gate changes back to a high state, which returns the output of CMOS transmission gate 102 to low and returns the signal controlling NFET 54 to high, resetting the latch.

The present invention does not require a reset path to adjust the pulse widths, and any reasonable pulse extension value can be obtained (i.e., it can be any fraction or multiple of a gate delay, not just whole multiples). In the depicted embodiment, the design is adjusted so that the UP and DOWN outputs rise only to $V_{dd}/2$ for zero phase error, eliminating the mismatch concerns in subsequent stages (such as might occur in U.S. Pat. No. 5,546,052). The present invention does not have this problem since the critically-timed paths consist of only inverters, a precharged switch, and a two-input NAND gate. This approach produces a dead zone of less than one picosecond. The circuit may be tuned by selecting various delay times for the CMOS devices in the detector. FIGS. 3A and 3B include suitable values for the critical paths. In particular, the delay elements are constructed to provide an 80 picosecond pulse stretch of the delay signals, by using first and third delay elements 150 and 174 each having a first delay $\tau_1$ of 170 picoseconds, and second and fourth delay elements 164 and 188 each having a second delay $\tau_2$ of 90 picoseconds.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

I claim:

1. A phase/frequency detector comprising:
   a first input for receiving a first input signal;
   a second input for receiving a second input signal;
   means connected to said first and second inputs for generating first and second output pulses wherein, if the first input signal arrives before the second input signal, the first output pulse has a duration which is proportional to a time delay between the first and second input signals and, if the second input signal arrives before the first input signal, the second output pulse has a duration which is proportional to a time delay between the first and second input signals, said generating means having a dead zone associated with very small phase differences between the first and second input signals, and including a first self-resetting, complementary metal-oxide semiconducting (SRCMOS) gate for providing a first derived signal based on said first input signal, a second SRCMOS gate for providing a second derived signal based on said second input signal, a first latch for preventing said first SRCMOS gate from discharging before a reset signal, and a second latch for preventing said second SRCMOS gate from discharging before the reset signal, wherein the reset signal is a logical function of the first and second derived signals; and means for reducing the dead zone by increasing the durations of the first and second output pulses.

2. The phase/frequency detector of claim 1 wherein:

said means for reducing the dead zone includes a plurality of logic gates having at least one gate delay; and the durations of the first and second output pulses are increased by a non-whole fraction of said gate delay.

3. The phase/frequency detector of claim 2 wherein:

said means for reducing the dead zone includes a first delay element having a delay $\tau_1$, and a second delay element having a delay $\tau_2$; and said non-whole fraction is equal to $\tau_1-\tau_2$.

4. The phase/frequency detector of claim 1 wherein:

said generating means has a reset path; and said means for reducing the dead zone is outside of said reset path.

5. The phase/frequency detector of claim 1 wherein said means for reducing the dead zone produces a dead zone of less than one picosecond.

6. The phase/frequency detector of claim 1 wherein said means for reducing the dead zone increases the durations of the first and second output pulses by delaying the effect of a rising transition of the later of the first and second input signals.

7. The phase/frequency detector of claim 1 wherein said generating means generates first and second output pulses whose duration is equal to the time delay between the first and second input signals.

8. A phase-lock loop circuit using the phase/frequency detector of claim 1, and further comprising:

a charge pump having inputs which receive the first and second output pulses;

a low-pass filter connected to an output of said charge pump; and a voltage-controlled oscillator controlled by said low-pass filter, and providing said second input signal to the phase/frequency detector.

9. A phase/frequency detector comprising:

a first input for receiving a reference signal;

a second input for receiving a feedback signal;

a first self-resetting, complementary metal-oxide semiconducting (SRCMOS) gate for providing a first derived signal based on said reference signal;

a second SRCMOS gate for providing a second derived signal based on said feedback signal;

means for resetting said first and second SRCMOS gates based on the first and second derived signals;

a first latch for preventing said first SRCMOS gate from discharging before a reset signal; and a second latch for preventing said second SRCMOS gate from discharging before the reset signal;

a first delay element for introducing a delay of $\tau_1$ to said first derived signal;

a second delay element for introducing a delay of $\tau_2$ to said first derived signal, wherein $\tau_1$ is not equal to $\tau_2$;

a third delay element for introducing the delay of $\tau_1$ to said second derived signal;

a fourth delay element for introducing the delay of $\tau_2$ to said second derived signal;

a first NAND gate having first and second inputs connected to outputs of said first and fourth delay elements; and a second NAND gate having first and second inputs connected to outputs of said second and third delay elements.

10. The phase/frequency detector of claim 9 wherein:

said first and second SRCMOS gates have a dead zone associated with very small phase differences between the reference and feedback signals; and said dead zone is less than one picosecond.

11. A method of providing a phase error signal associated with first and second input signals, comprising the steps of:

creating first and second derived signals based on the first and second input signals, respectively, using first and second self-resetting, complementary metal-oxide semiconducting (SRCMOS) gates;

setting first and second latches to prevent the first and second SRCMOS gates from discharging before a reset signal, wherein the reset signal is a logical function of the first and second derived signals;

creating first and second delayed signals based on the first derived signal, and third and fourth delayed signals based on the second derived signal;

combining the first delayed signal with the fourth delayed signal in a NAND function to generate a first output pulse if the first input signal arrives before the second input signal; and combining the second delayed signal with the third delayed signal in a NAND function to generate a second output pulse if the second input signal arrives before the first input signal.

12. The method of claim 11 wherein said steps of creating the delayed signals include the step of selecting appropriate delay values to reduce a dead zone associated with very small phase differences between the first and second input signals.

13. The method of claim 12 wherein said step of selecting appropriate delay values includes the steps of:

delaying the first derived signal by a delay $\tau_1$ to create the first delayed signal;

delaying the first derived signal by a delay $\tau_2$ to create the second delayed signal, wherein $\tau_1$ is not equal to $\tau_2$;

delaying the second derived signal by the delay $\tau_1$ to create the third delayed signal; and delaying the second derived signal by the delay $\tau_2$ to create the fourth delayed signal.

14. The method of claim 12 wherein said steps of creating the delayed signals include the step of selecting the appropriate delay values to produce a dead zone of less than one picosecond.

* * * * *

UNITED STATES PATENT AND TRADEMARK OFFICE
CERTIFICATE OF CORRECTION

PATENT NO. : 5,977,801
DATED : November 2, 1999
INVENTOR(S) : David W. Boerstler It is certified that error appears in the above-identified patent and that said Letters Patent is hereby corrected as shown below:

Column 1, Lines 61--62 please delete "flops), b".

Signed and Sealed this

Second Day of January, 2001

Attest:

Attesting Officer

Q. TODD DICKINSON
Commissioner of Patents and Trademarks